United States Patent
Huynh Luong et al.

[11] Patent Number: 5,708,393
[45] Date of Patent: Jan. 13, 1998

[54] HIGH VOLTAGE OPERATIONAL AMPLIFIER OUTPUT STAGE

[75] Inventors: Thien Huynh Luong, Epalinges; Hienz Lehning, Nyon, both of Switzerland

[73] Assignee: Motorola, Inc., Schaumburg, Ill.

[21] Appl. No.: 662,158

[22] Filed: Jun. 12, 1996

[30] Foreign Application Priority Data

Jun. 24, 1995 [GB] United Kingdom ............... 95129458

[51] Int. Cl.⁶ ..................................... H03F 3/30
[52] U.S. Cl. .................. 330/265; 330/255; 330/267; 330/271; 330/273
[58] Field of Search ........................... 330/255, 265, 330/267, 268, 271, 273, 274

[56] References Cited

U.S. PATENT DOCUMENTS 3,887,878  6/1975  Schade, Jr. ........................ 330/267

FOREIGN PATENT DOCUMENTS 0355918  2/1990  European Pat. Off. .
2043379  10/1980  United Kingdom .

*Primary Examiner*—James B. Mullins
*Attorney, Agent, or Firm*—Harry A. Wolin; Rennie William Dover; Sharon K. Coleman

[57] ABSTRACT

A current sourcing output stage for a high voltage operational amplifier receives a low voltage input signal ($V_{IN}$) and provides a high current output signal corresponding to the low voltage input signal at an output terminal (8). A first PNP transistor (Q1) is coupled between a voltage supply ($V_{CC}$) and a plurality of cascaded PNP transistors (Q2, Q3, Q8–Q11) coupled to the output terminal (8). The base of the first PNP transistor (Q1) is coupled to receive the input signal ($V_{IN}$) and the bases of the cascaded PNP transistors are coupled to receive different bias voltages A control circuit (Q5–Q7, R1–R5) is coupled to the voltage supply ($V_{CC}$) and has an input coupled to the output terminal (8) for deriving a plurality of bias voltages and to the cascaded PNP transistors (Q2, Q3, Q8–Q11) to supply the bias voltages to the respective bases of the cascaded PNP transistors, so that the cascaded PNP transistors (Q2, Q3, Q8–Q11) are biased by bias voltages dependent on the voltage swing of the output signal.

6 Claims, 3 Drawing Sheets

HIGH VOLTAGE OPERATIONAL AMPLIFIER OUTPUT STAGE

FIELD OF THE INVENTION

This invention relates to an output stage for a high voltage operational amplifier, and more particularly to a current sourcing output stage for a high output voltage amplifier utilising only low voltage devices.

BACKGROUND OF THE INVENTION

In usual applications requiring high output voltage amplifiers, the amplifiers are manufactured utilising high voltage devices. This causes difficulties in trying to manufacture the amplifier in low voltage processes. These difficulties have been overcome by utilising low voltage devices but combining them with high voltage external discrete components, which is expensive, or by using floating differential power supply devices to achieve high voltage drive capability. In U.S. Pat. No. 4,697,155, there is disclosed a high voltage amplifier output stage utilising low voltage cascaded NPN Darlington transistors. However this amplifier has a saturation voltage at high voltage swings of several volts, which causes reduced amplitude swing.

Thus, it has not proved possible, and it is an object of the present invention, to provide an output stage for a high output voltage operational amplifier formed solely of low voltage devices and having a low saturation voltage.

BRIEF SUMMARY OF THE INVENTION

Accordingly, the invention provides a current sourcing output stage for a high voltage operational amplifier, the output stage comprising:

an input terminal for receiving a low voltage input signal;

an output terminal for providing a high current output signal corresponding to the low voltage input signal;

a first PNP transistor coupled between a voltage supply terminal and a plurality of cascaded PNP transistors coupled to the output terminal, the base of the first PNP transistor being coupled to the input terminal and the bases of the cascaded PNP transistors being coupled to receive different bias voltages; and a control circuit coupled to the voltage supply terminal and to the output terminal for deriving a plurality of bias voltages and to the cascaded PNP transistors to supply the bias voltages to the respective bases of each of the cascaded PNP transistors, whereby the cascaded PNP transistors are biased by bias voltages dependent on the swing of the current output signal.

In a preferred embodiment, the control circuit comprises an input coupled to the output terminal, a resistive voltage divider network coupled between the input and the voltage supply terminal to provide the plurality of bias voltages and a plurality of Darlington networks respectively coupled between the resistive voltage divider network and the respective bases of the cascaded PNP transistors to buffer the bias voltages thereto, each Darlington network being formed of a plurality of devices. Preferably, a plurality of diodes is coupled between the resistive voltage divider network and the voltage supply terminal, the number of diodes being equal to the number of devices in each Darlington network plus one.

Preferably, a diode is coupled between the output terminal and the input of the control circuit. In a preferred embodiment, a clamping circuit is coupled between the input of the control circuit and the voltage supply terminal via a reference voltage source, thereby allowing the cascaded PNP transistors to go into saturation.

Thus, all the devices utilised in the amplifier output stage can be formed in low voltage processes and the amplifier output stage has low output saturation.

BRIEF DESCRIPTION OF THE DRAWINGS

One embodiment of the invention will now be more fully described, by way of example, with reference to the drawings, of which.

DETAILED DESCRIPTION

Figure 1:
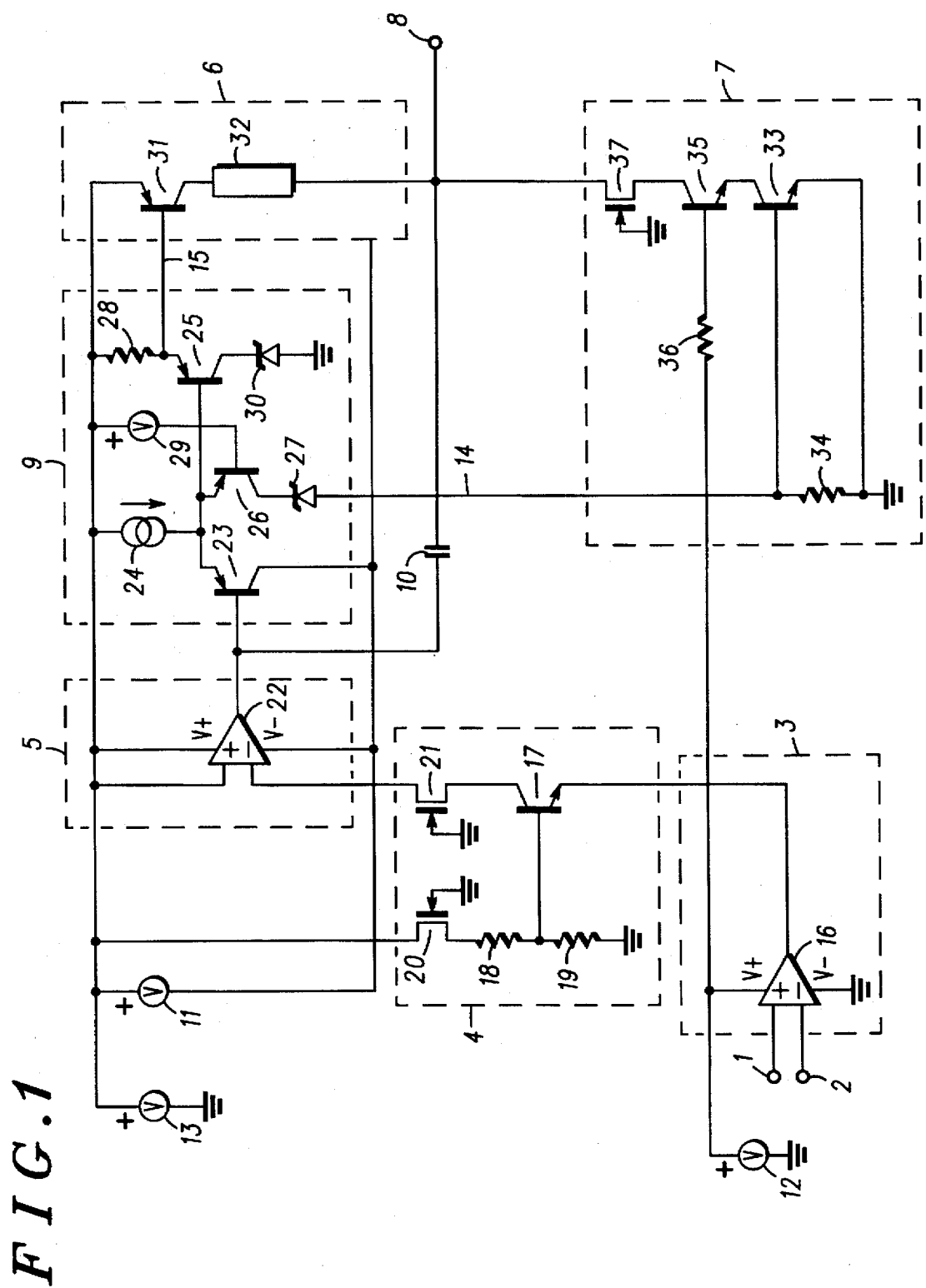
FIG. 1 shows a schematic diagram of a complete high voltage amplifier incorporating the invention.

Thus, as shown in FIG. 1, a high output voltage amplifier includes a transconductance stage 3 coupled to receive a differential input signal having low DC bias from input terminals 1 and 2. An auto-biased voltage buffer stage 4, is coupled between the transconductance stage 3 and an intermediate current-controlled voltage source stage 5, whose output is coupled to a voltage-controlled interface stage 9 having a current output 14 and a voltage output 15. The voltage output 15 is coupled to an input of a current sourcing stage 6 and the current output 14 is coupled to a current-controlled sinking stage 7. Outputs of the current sourcing stage 6 and the current-controlled sinking stage 7 are coupled together and to an output terminal 8 of the high output voltage amplifier.

A low voltage source 12 is used to provide power for a transconductance amplifier 16 forming the transconductance stage 3. The output of the transconductance amplifier 16 is coupled to an NPN transistor 17 forming part of the buffer stage 4, the base of the NPN transistor 17 being coupled to a voltage divider network formed by resistors 18 and 19 coupled between a ground reference potential and a JFET 20 powered from a high voltage source 13. The NPN transistor 17 is coupled to a further JFET 21 to provide an output of the buffer stage 4 to a negative input of a transimpedance amplifier 22, forming part of the intermediate stage 5 and whose positive input is coupled to the high voltage source 13. The transimpedance amplifier 22 is powered from the high voltage source 13 and from a second low voltage source 11. The output of the transimpedance amplifier 22, forming the output of the intermediate stage 5, is coupled, via a Miller capacitor 10, to the output terminal 8 to provide stability.

The output of the intermediate stage 5 is also coupled to the interface stage 9 at the base of an emitter follower PNP transistor 23, whose emitter is coupled to a current source 24 and whose collector is coupled to the low voltage source 11. The emitter of transistor 23 is coupled to drive the base of a further emitter follower PNP transistor 25, whose emitter provides the voltage output 15 of the interface stage 9. A resistor 28 is coupled to the emitter of transistor 25 to polarise it and the collector of the transistor 25 is coupled to a ground reference potential via a Zener diode 30 to prevent its breakdown. The emitter of transistor 23 is also coupled to the emitter of a further PNP transistor 26 forming a differential pair, the base of the transistor 26 being coupled to a reference voltage source 29 and the collector providing, via a Zener diode 27, the current output 14 of the interface stage 9.

The voltage output 15 of the interface stage 9 is used to control a sourcing PNP transistor 31 of the current sourcing stage 6. The output of transistor 31 is passed to a complex PNP circuit 32, powered from the low voltage source 11, and which will be more fully described below with reference to FIG. 2, to provide the output of the sourcing stage 6.

The current output 14 of the interface stage 9 is coupled to the sinking stage 7 where it controls an NPN common emitter transistor 33 and is polarised by resistor 34. The emitter of the sinking transistor 33 is coupled to ground reference potential while its collector is coupled to the emitter of an NPN cascode transistor 35, the base of which is coupled to the low voltage source 12 via a resistor 36. The collector of transistor 35 is coupled to the source of a JFET 37, the drain of which provides the output of the sinking stage 7.

Figure 2:
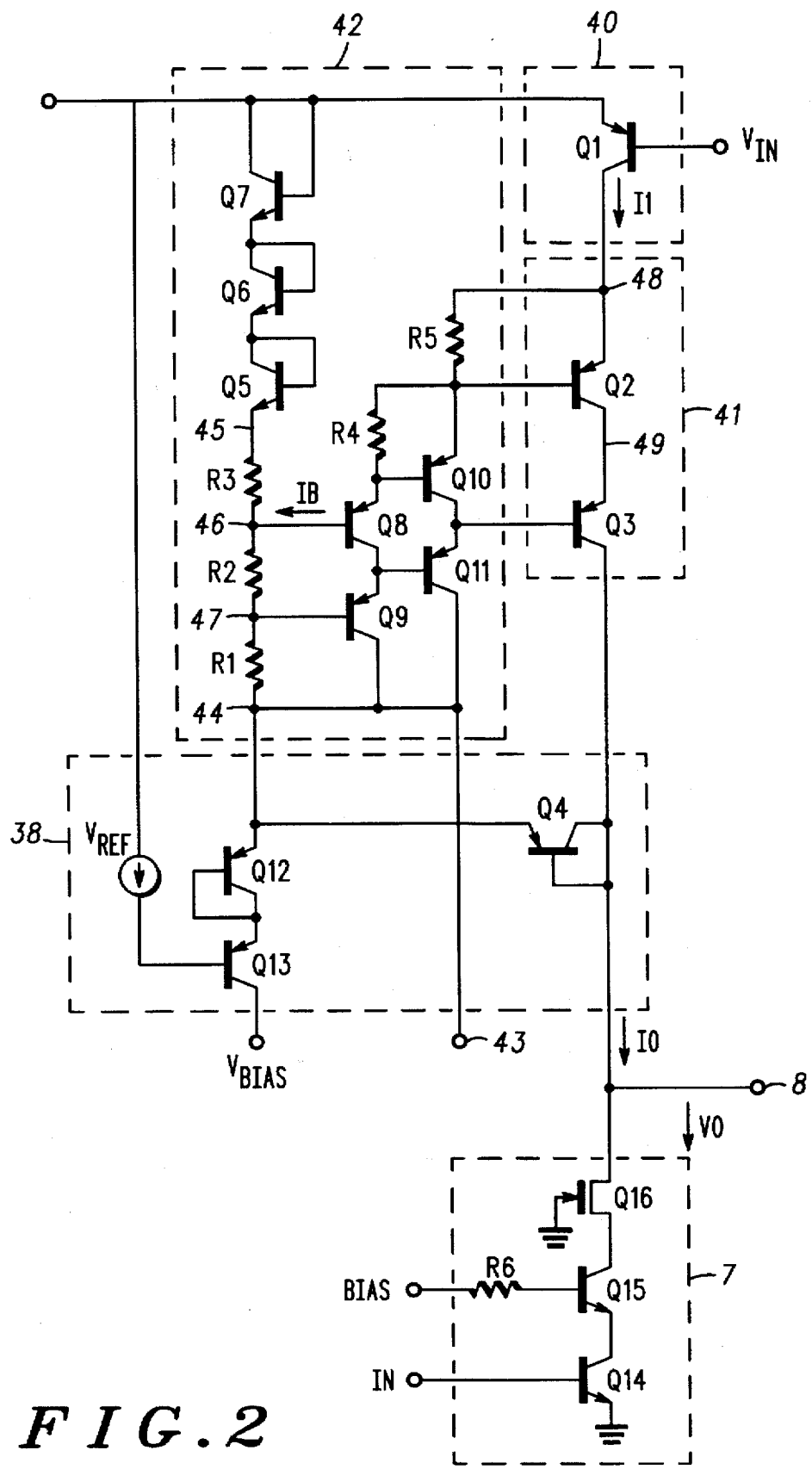
FIG. 2 shows a more detailed circuit diagram of an amplifier output stage according to the present invention.

A more detailed embodiment of the output sourcing stage 6 is shown in FIG. 2, where identical elements to those of FIG. 1 generally have the same reference numerals as in FIG. 1. In this embodiment, a low impedance voltage $V_{IN}$, for example that taken from the emitter of the PNP transistor 25 of the interface stage 9, is applied to the base of a PNP output sourcing transistor Q1 (equivalent to transistor 31 in FIG. 1). This transistor functions as a transconductance amplifier stage 40 and produces a current I1 at its collector. The current I1 flows into the emitter of a PNP transistor Q2 whose collector is connected to the emitter of another PNP transistor Q3. In this manner, current conducting stage 41 formed by transistors Q2 and Q3 passes the current I1 to the output terminal 8 as a current I0. Current I0 sources a current to the load, thus creating an output voltage $V_O$ relative to ground reference.

The cathode of a diode Q4 (a PNP transistor configured in diode mode) is connected to the output terminal 8, the anode of which is connected to a control input 43 of a control circuit stage 42. The control input 43 of the control circuit stage 42 is coupled to one end 44 of a voltage divider network formed of three equal resistors R1, R2 and R3. The other end 45 of the voltage divider network is connected, via three cascaded diodes Q5, Q6 and Q7 (NPN transistors configured in diode mode), to a high voltage supply $V_{CC}$. Consequently, the voltage drops across the three resistors are equal to:

$$(V_{CC} - V_O - 4V_{BE})/3$$

where $V_{BE}$ is the base-emitter voltage drop of the diodes.

Figure 3:
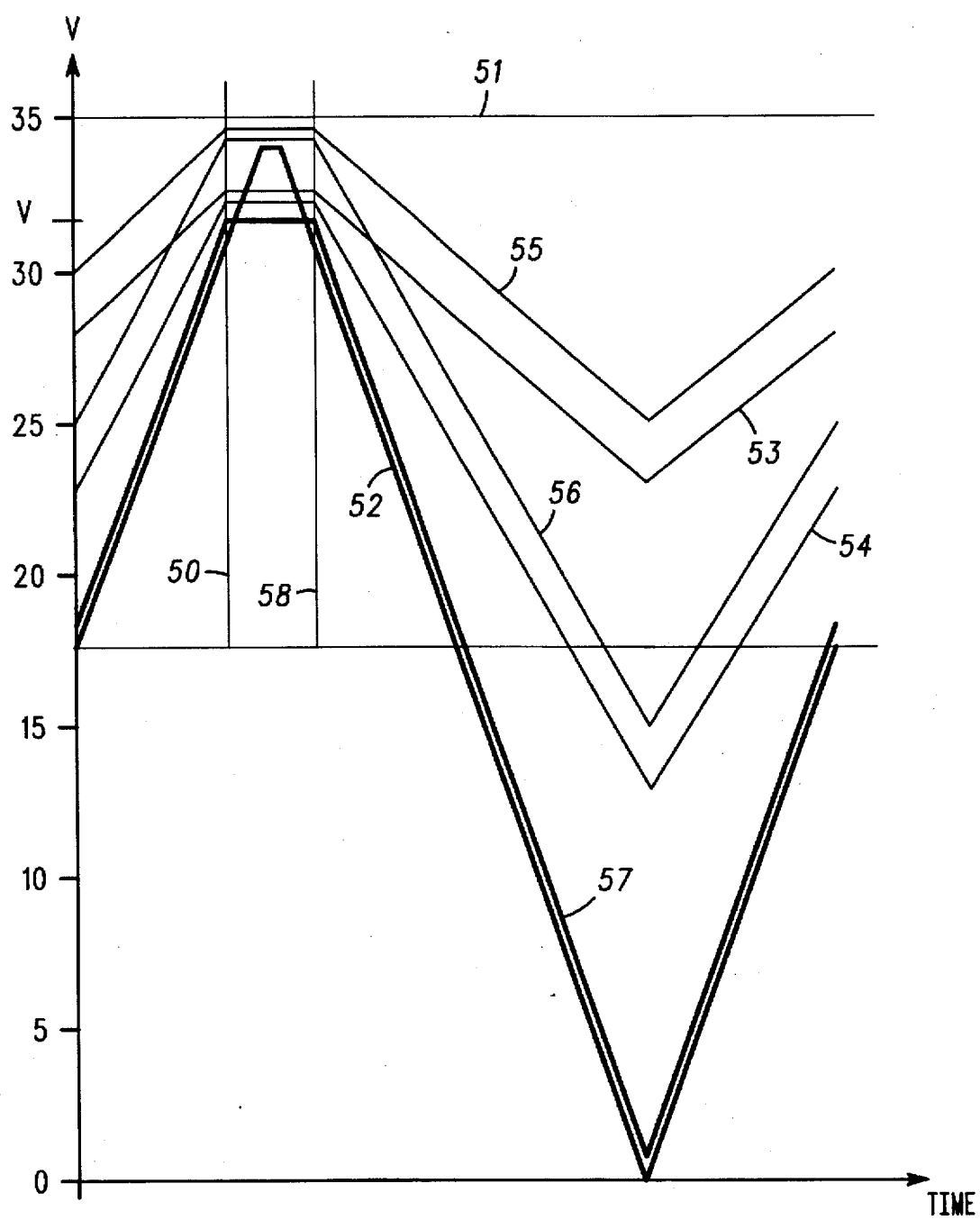
FIG. 3 shows voltage levels at various nodes in the amplifier output stage of FIG. 2.

FIG. 3 shows the voltages at various nodes in the circuit. In particular, waveform 51 represents the supply voltage $V_{CC}$ and waveform 52 represents the output voltage $V_O$. Waveforms 53 and 54 represent voltages $V_B$ and $V_C$ at central nodes 46 and 47, respectively, of the voltage divider network. Waveforms 55 and 56 represent voltages $V_D$ and $V_E$ at nodes 48, between transistors Q1 and Q2, and 49, between transistors Q2 and Q3, respectively, and waveform 57 represents the voltage at the control input 43 of the control circuit stage 42.

The two centre nodes 46 and 47 of the voltage divider network are connected respectively to the bases of PNP transistors Q8 and Q9. The emitter of transistor Q8 is coupled to the base of transistor Q10 to form a Darlington transistor pair. In the same manner, transistors Q9 and Q11 form another PNP Darlington transistor pair, which is cascaded with the previous PNP Darlington transistor pair by connecting the respective emitters to the collectors of transistors Q8 and Q10. The outputs of these cascaded PNP Darlington pairs, taken at the emitters of transistors Q10 and Q11, drive the bases of the PNP transistors Q2 and Q3. The remaining collectors of transistors Q9 and Q11 are connected to the control input 43 of the control circuit stage 42 to complete the loop. Resistors R4 and R5, connected respectively to the emitter-base junctions of transistors Q10 and Q2, are used to polarise the cascaded Darlington transistor pairs. Thus, the voltage drops across resistors R3, R2 and R1 are passed to the PNP transistors Q1, Q2 and Q3, respectively. In this way, the voltage seen from the emitter to the collector of each PNP is equal to:

$$(V_{CC} - V_O - 4V_{BE})/3.$$

When $V_O$ is equal to zero, the drops reach their maximum of $(V_{CC} - 4V_{BE})/3$. Thus, in such a scheme approximately three times the PNP emitter-collector breakdown voltage can be dealt with. Of course, a higher number of PNP transistors could be chosen to enlarge the voltage capability. In this embodiment, the number three is chosen to ensure the local stability of the PNP Darlington transistor pairs. The cascaded Darlington PNP transistors Q8 to Q11 are used to boost the current to the load.

The control circuit stage 42 has a large voltage drop between $V_{CC}$ and the output terminal 8. This situation is undesirable, so a clamp circuit 38 is implemented to eliminate this problem. This clamp circuit 38 is composed of a PNP transistor Q13 and a PNP diode Q12, the cathode of the latter being connected to the emitter of the former. The anode of the diode Q12 is coupled to the control input 43 of the control circuit stage 42. The base of transistor Q13 is then coupled to the high supply voltage $V_{CC}$ via a low reference voltage supply $V_{REF}$ and its collector is biased by a bias voltage $V_{BIAS}$.

As shown in FIG. 3, when the output voltage $V_O$ increases beyond the threshold voltage $V_{TH}$ equal to $(V_{CC} - V_{REF} + V_{BE})$, the clamp circuit 38 operates to anchor the control input 43 of the control circuit stage 42 to $(V_{TH} + V_{BE})$, then turns the diode Q4 off and disconnects the output terminal 8 from the control circuit stage 42. This releases the output terminal 8, at which the voltage starts to increase until the PNP transistor Q3 reaches saturation. The threshold voltage $V_{TH}$ is chosen such that when the PNP transistor Q1 starts to saturate, the clamping function begins to operate, as shown in FIG. 3 between lines 50 and 58. This is the optimal value of $V_{TH}$, but $V_{TH}$ must be 100 mV lower to ensure the off condition of transistor Q4. The voltage between the emitter and the collector of transistor Q2 is equal to the saturation voltage $V_{SAT}$ of transistor Q1 plus $R2.I_B$, where R2 is the resistance value of resistor R2 and $I_B$ is the base current of Q8. The total output voltage drop is equal to:

$$3V_{SAT} + R2.I_B.$$

FIG. 2 also shows the output sinking stage 7 having an input for receiving the current output IN of the interface stage 9 coupled to the base of NPN common-emitter transistor Q14. The emitter of transistor Q14 is grounded while its collector is coupled to the emitter of an NPN cascode transistor Q15. The base of transistor Q15 is coupled to a low bias voltage BIAS via resistor R6 which allows the NPN transistor Q15 to go into saturation. The collector of transistor Q15 is connected to the source of a JFET Q16, the drain of which is coupled to the output terminal 8. This JFET Q16 functions as a voltage buffer. Thus, the combination of the high current outputs of the output sourcing and sinking stages produces the high voltage output signal at the output terminal.

It will be appreciated that although only one particular embodiment of the invention has been described in detail, various modifications and improvements can be made by a person skilled in the art without departing from the scope of the present invention.

We claim:

1. A current sourcing output stage for a high voltage operational amplifier, the output stage comprising:

an input terminal for receiving a low voltage input signal;

an output terminal for providing a high current output signal corresponding to the low voltage input signal;

a first PNP transistor coupled between a voltage supply terminal and a plurality of cascaded PNP transistors coupled to the output terminal, the base of the first PNP transistor being coupled to the input terminal and the of the bases of the cascaded PNP transistors being coupled to receive different bias voltages; and a control circuit coupled to the voltage supply terminal and having an input coupled to the output terminal for deriving a plurality of bias voltages and to the cascaded PNP transistors to supply the bias voltages to the respective bases of the cascaded PNP transistors, whereby the cascaded PNP transistors are biased by bias voltages dependent on the voltage swing of the output signal.

2. A current sourcing output stage according to claim 1, further comprising a resistive voltage divider network coupled between the input and the voltage supply terminal to provide the plurality of bias voltages and a plurality of Darlington networks respectively coupled between the resistive voltage divider network and the respective bases of the cascaded PNP transistors to buffer the bias voltages thereto, each Darlington network being formed of a plurality of devices.

3. A current sourcing output stage according to claim 2, further comprising a plurality of diodes coupled between the resistive voltage divider network and the voltage supply terminal, the number of diodes being equal to the number of devices in each Darlington network plus one.

4. A current sourcing output stage according to claim 1, further comprising a diode coupled between the output terminal and the input of the control circuit.

5. A current sourcing output stage according to claim 1, further comprising a clamping circuit coupled between the input of the control circuit and the voltage supply terminal via a reference voltage source, thereby allowing the cascaded PNP transistors to go into saturation.

6. A current sourcing output stage according to claim 1, wherein all the devices utilised in the amplifier output stage are formed in low voltage processes and the amplifier output stage has low output saturation.

* * * * *